United States Patent [19]

Bassen et al.

[11] Patent Number: 5,465,013
[45] Date of Patent: Nov. 7, 1995

[54] ELECTRIC FIELD SHIELDING SYSTEM FOR AC ELECTRICALLY POWERED DEVICE WITH A TWO-BLADE PLUG

[75] Inventors: Howard I. Bassen, Chevy Chase; John P. Casamento, Gaithersburg, both of Md.

[73] Assignee: The Government of the United States of America as represented by the Secretary of the Department of Health and Human Services, Washington, D.C.

[21] Appl. No.: 90,231

[22] Filed: Jul. 12, 1993

[51] Int. Cl.$^6$ .................... H01J 31/00; H04B 3/28; H05K 9/00
[52] U.S. Cl. .................... 307/91; 219/528; 307/326; 313/479; 348/818
[58] Field of Search .................... 307/326, 91, 327, 307/89; 174/5 R, 55 B, 5 SG, 35 R; 313/313, 479; 358/255, 245; 315/8, 85; 333/12; 439/678, 679; 219/212, 541, 528, 529; 178/69 B; 336/84 R, 84 C, 84 M; 361/212, 220; 348/818, 820

[56] References Cited

U.S. PATENT DOCUMENTS

| | | | |
|---|---|---|---|
| 3,039,075 | 6/1962 | Stollman | 439/679 |
| 3,697,896 | 10/1972 | Sarkozi et al. | 333/12 |
| 3,982,098 | 9/1976 | Trostler | 219/528 |
| 4,041,364 | 8/1977 | Gauper, Jr. | 307/91 |
| 4,931,625 | 6/1990 | Marlinski | 219/528 |
| 5,132,649 | 7/1992 | Sakamoto et al. | 333/12 |
| 5,218,185 | 6/1993 | Gross | 219/528 |

OTHER PUBLICATIONS

The New York Times Article, "Scientists Debate Health Hazards of Electromagnetic Fields", Jul. 11, 1989.

Primary Examiner—William M. Shoop, Jr.
Assistant Examiner—Richard T. Elms
Attorney, Agent, or Firm—Lowe, Price, LeBlanc & Becker

[57] ABSTRACT

An electric field shield for non-grounded AC powered appliances is connected to a neutral return terminal of the AC power distribution system. A polarized two prong connector assures connection of the shield to neutral. By eliminating a requirement for connection of the shield to ground, shields are made available for appliances precluded from ground connection such as bedding heaters. A double pole control switch is included to eliminate E-field generation in an OFF state caused by improper wiring or the use of unpolarized intermediate connectors. The shield is insulated and a current limiting device is series connected between the shield and neutral to reduce electrical hazards.

30 Claims, 7 Drawing Sheets

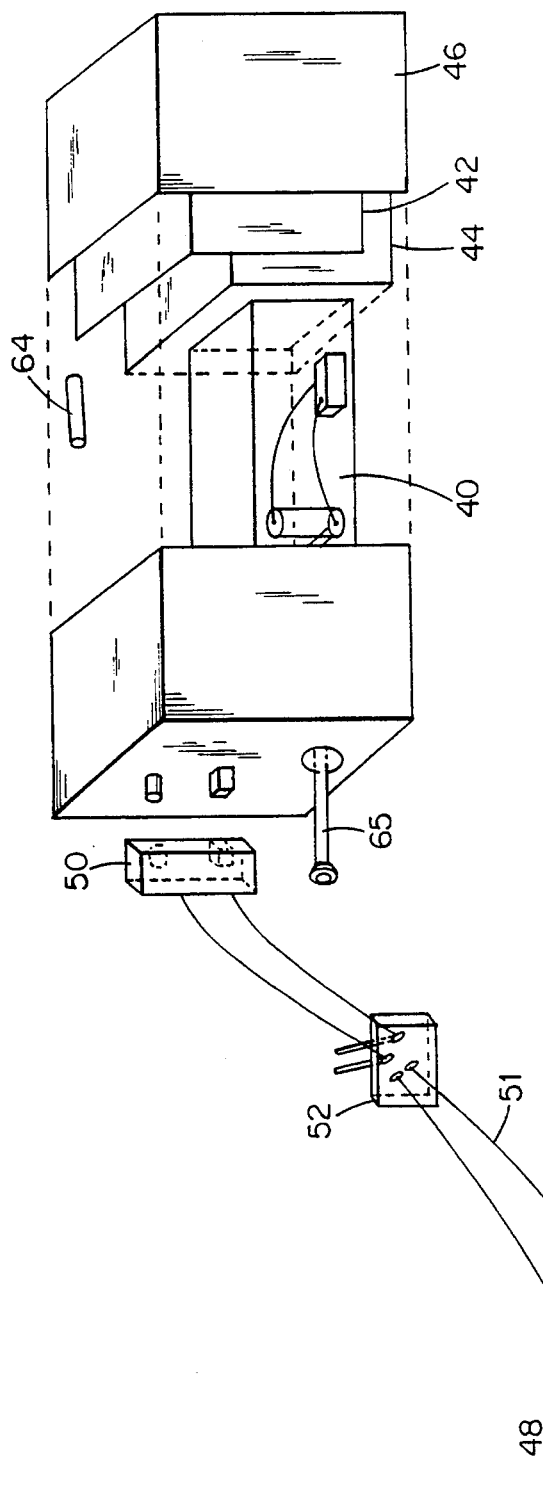
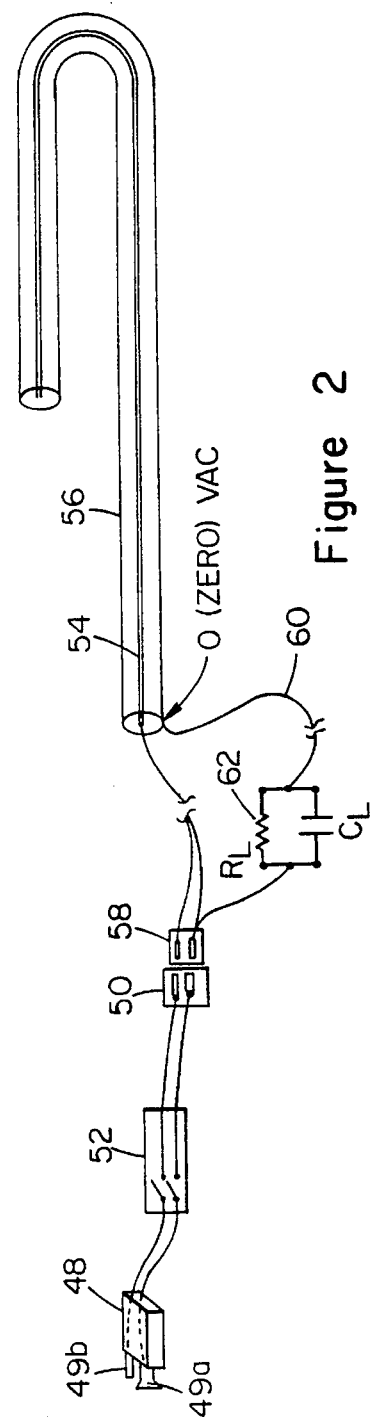
Figure 1
Figure 2

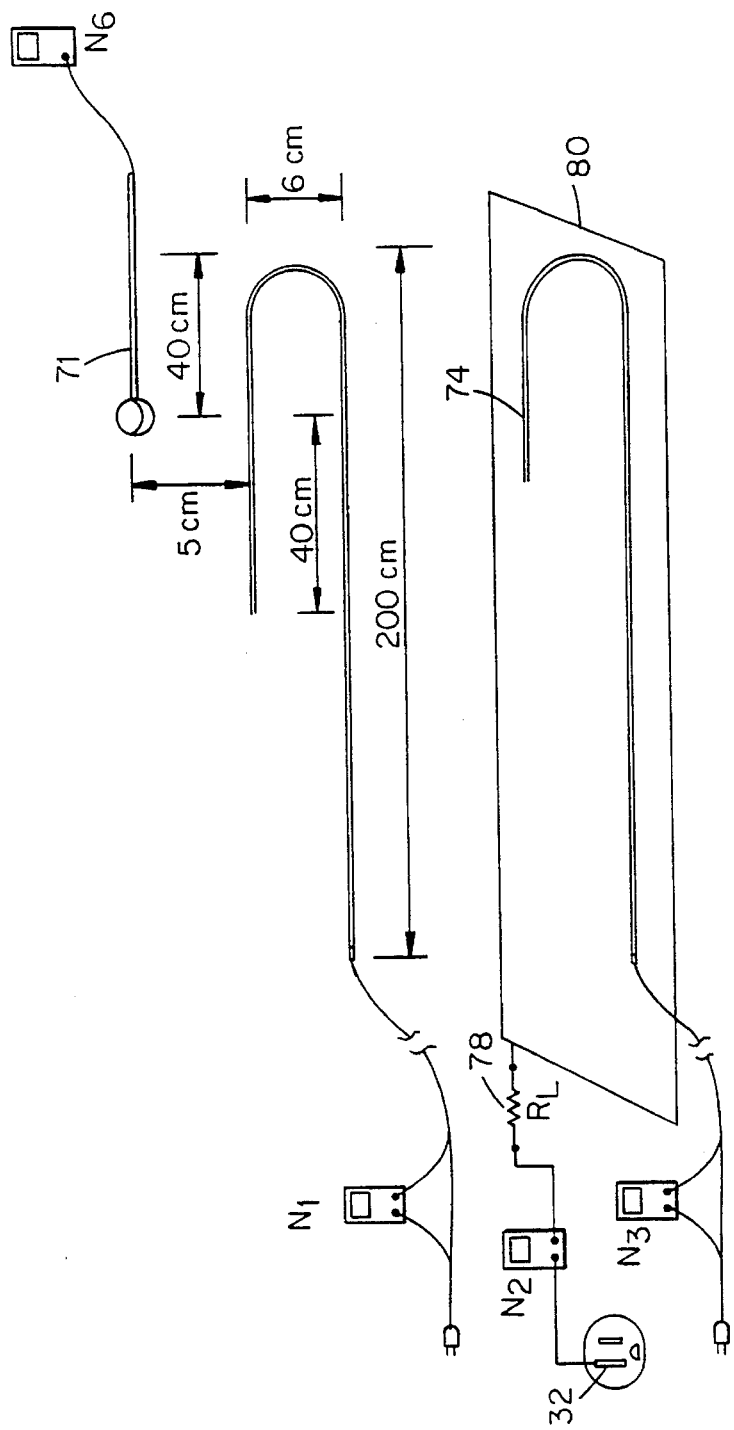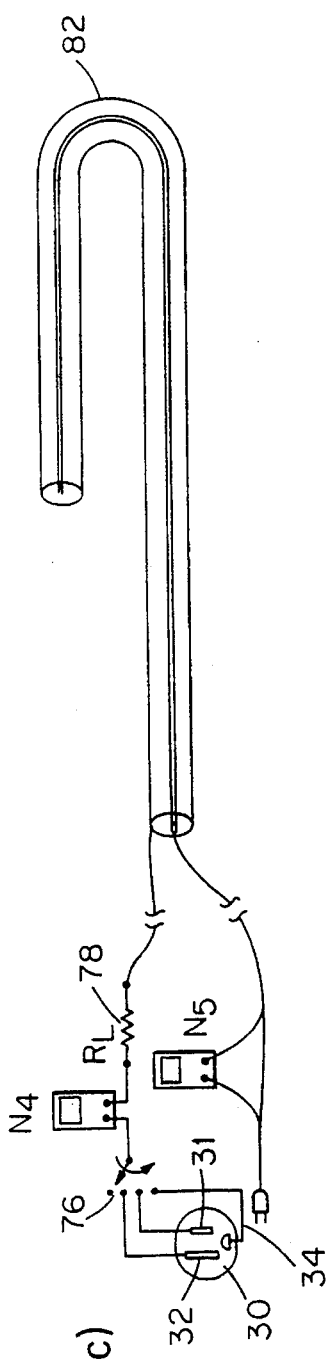
Figure 5(a)  Figure 5(b)  Figure 5(c)

ELECTRIC FIELD SHIELDING SYSTEM FOR AC ELECTRICALLY POWERED DEVICE WITH A TWO-BLADE PLUG

TECHNICAL FIELD

This invention relates to an electric field shielding system for an AC electrically powered device, and more particularly to an electric field shielding system for an ungrounded AC powered device, which is precluded from a connection to safety ground and which is connected to an AC power supply system by a two prong, ungrounded, connector.

BACKGROUND ART

Various devices are known for reducing, minimizing or eliminating human exposure to high levels of electric fields (E-fields) in frequency ranges of 0 to 400,000 Hz, i.e., to E-fields of ELF (extremely low frequency, in the range of 0–3 KHz) and VLF (very low frequency, in the range of 3 KHz–400 KHz). Exposure to these fields may induce undesirable biological effects in humans. It is known that E-field shields require a connection to electric ground. Thus, known shields all include and require a ground connection.

Known shielding devices include faraday cages, coaxial shields, shielded multiconductor cables and E-field shielding plates. A common characteristic of known shielding devices is the use of a conductive shield, surrounding or obstructing passage of electric field lines. In the prior art, however, shielding devices are all provided with a ground connection.

Because of safety or regulatory provisions, some devices, such as electrically heated bed covering for example, are precluded from having a ground connection. Accordingly, although reduction of electric field emissions by heated bed covering is a desirable goal, it has been impossible to meet such a goal in view of regulatory prohibition of a ground connection to such bed covering.

In general, there exist numerous electrical devices or appliances which, whether because of double insulation, the use of a two blade polarized connector, or for other reasons, are not grounded. While electric and magnetic fields are produced by presence of electrical voltage and current, respectively, in devices such as electrically heated bed coverings, video display terminals and double insulated appliances, such devices can not use a three blade plug or other connection to safety ground of the electrical power distribution system. Accordingly, such devices have been left without any E-field shielding by the prior art.

One reason that E-field shielding has not been provided in certain electrically powered devices is the very inability to use a ground connection, and the resulting attendant risk of personal injury or damage to persons or property coming into physical contact with ungrounded shields, as well as the conventional wisdom that electrical conductors must be grounded to provide effective shielding.

For example, a faraday cage is known as an effective shield for reducing ELF and VLF E-field emissions from an AC electrically-powered device. Such a shield, shown in FIG. 6, is formed of a thin walled, conductive enclosure 10 which completely surrounds the E-field emitting object (or appliance) 12. If more than one piece of conductive material is used to fabricate a single layered faraday cage, all the pieces, or sheets, of conductive material are electrically connected along common adjacent borders. As seen in FIG. 6, the faraday cage requires a ground connection 14.

The wires or conductors 15 which connect the appliance in the faraday cage to the AC power distribution system must also be shielded using individual coaxial shields or a shielded multiconductor cable, separately described below.

Thus, while a faraday cage can be used to reduce E-field emissions from AC powered devices, such a cage is only used in the prior art in conjunction with a ground connector 14, connecting the cage to safety ground of the power distribution system.

Another known form of shield, which is a special form of the faraday cage, is a coaxial shield used to shield a single electrical conductor or wire. Such a shield is shown in FIG. 7, wherein an inner conductor 16 to be shielded is surrounded by a non-conducting material 18, such as air, a vacuum, a special dielectric material, or insulating material. An outer conductor 20, or shield, is then wrapped around and surrounds the non conductor 18. The shield 20 is typically composed of a wire and foil combination, or braided wire that forms a thin, continuous layer completely surrounding the inner conductor 16, with dielectric 18 therebetween. An insulating outer jacket 21 surrounds conductor 20. The coaxial shielding technology of FIG. 7 can be used in an AC electrical power distribution system to reduce E-field emissions.

In such an application, inner conductor 16 is the wire carrying current to the electrical load, and shield 20 acts as the second conductor in the electrical circuit, carrying the current back from the load to the source.

However, in the prior art, when an arrangement such as shown in FIG. 7 is used as an E-field shield in an AC powered electrical system, the outer conductor 20 is connected to safety ground of the distribution system.

A shielded multiconductor cable is a special form of the faraday cage or the coaxial conductor. Such a shielded multiconductor cable is illustrated at FIG. 8, and is used to reduce ELF and VLF E-field emissions from multiple wires or conductors routed to the same destination. In such a shielding approach, an outer conductor 20 is used which is identical to that used in the coaxial shield of FIG. 7. However, rather than surrounding a single conductor, the shield surrounds a plurality of inner conductors 22. The outer conductor has a circular cross section and is typically composed of wire and foil or braided wire in a thin, continuous layer which surrounds completely all of the inner conductors 22, as seen in FIG. 8. An outer conductor 20 for a multiconductor cable may have an irregularly shaped cross section.

Shielding of multiconductor cables as shown in FIG. 8 is used in AC electrical power distribution systems to reduce E-field emissions. In such an application, the plural inner conductors 22 carry currents to various electrical loads. Additional inner conductors (not shown) can also be used to carry the current back from each load to the AC power source.

However, when an arrangement such as shown in FIG. 8 is used as an E-field shield in the prior art, outer conductor 20 is connected to safety ground of the AC electrical distribution system, similarly to the required connections for FIGS. 6 and 7.

Yet another known shield, shown in FIG. 9A, is used to provide a partial reduction of ELF and VLF E-field emissions from certain AC electrically powered devices. Specifically, an E-field shielding plate 24 is used in conjunction with an electrically powered appliance such as a video display terminal (VDT) 26 used with a computer. Such shielding plates are frequently sold as an accessory for VDTs.

The shielding plate 24 typically uses a thin, optically-transparent and electrically-conductive film, or a thin wire mesh embedded in an optically transparent glare reducing plate. The plate 24 is placed in front of a viewing area of a VDT 26, as shown in FIG. 9A.

In order to make the shield plate 24 effective at the AC power line frequency, the prior art requires, and uses, a separate wire 28 (with or without a current limiting resistor) to connect shield plate 24 to an electrical grounding point, i.e., safety ground of the electrical power distribution system.

Thus, each of the known E-field shielding devices requires a connection to safety ground of the electrical power distribution system.

The above described known E-field shields thus cannot be incorporated in AC appliances that are double-insulated and/or use a two-wire electrical power cable and a two-blade plug. As hereinabove noted, the known shields require direct connection of a conductor from the shield to the safety ground of the AC power distribution system. In order to provide such connection, a known third (ground) connector of known three prong AC electrical plugs and outlets is used. Thus, AC powered devices using the known E-field shields can only be used at locations wherein an electrical power outlet has a three conductor receptacle, such as accommodates a three blade plug, with direct connection to safety ground. Alternatively, a trained electrician or technician must connect the shield to safety ground, using special adapters or wiring.

As above noted, however, there are some appliances which do not or cannot provide such a connection to safety ground. For example, UL ANSI 964 provides a standard for electrically heated bed coverings. The standard states that any electrical power wiring and associated attachment plug may contain two or more circuit conductors, but explicitly excludes a grounding conductor. Similar wiring is required for an interconnecting cord between a heating control unit and the bed covering or for other interconnections used in conjunction with the heated bed covering. Ground conductor prohibitions are required, in several instances, to prevent acute injuries, such as electrical shocks or burns due to heat generated by electrical short circuits, to persons who may physically contact a portion of the shielded appliance.

Thus, there is regulatory prohibition of connection of any grounding conductor to electrically heated bed coverings. Accordingly, E-field shielding has not been available for such an appliance, for other appliances similarly limited, or for double insulated appliances which are similarly prohibited from direct connection to safety ground via a separate grounding wire.

In order to define the various aspects, advantages and features of the invention, the following explanation is provided for several of the concepts associated with the invention, as they relate to grounding of standard AC electrical power distribution systems.

Referring to FIG. 10, there is illustrated an AC electrical outlet socket 30, having three connection receptacles. It is known that every AC electrically powered device has a first connection 31 to a source of electrical power. In a standard, properly wired, three receptacle electrical outlet 30, the ac source is connected to the shorter receptacle that mates with the narrower blade of the device's mating plug 51. It is also known to those skilled in the art that every AC electrically powered device must also have a direct connection to the neutral, or return conductor of the AC power distribution system. This connection consists of a wire or other conductor that carries all of the AC current flowing from the electrically powered device back to the AC distribution system. No device or appliance is able to operate properly and safely without being connected to the neutral, or return point of the ac power distribution system.

In FIG. 10, the neutral conductor of the AC power distribution system is connected to the longer receptacle 32 that can only mate with the wider-tipped flat blade 49 of the device mating plug. An optional safety ground, or grounding conductor 34, is typically incorporated in an AC power distribution system. The safety ground is a third conductor, routed from a single zero-voltage grounding point in the electrical distribution system to each individual electrical outlet in a house or workplace.

It is known that safety grounding conductors never intentionally carry current to or from an electrically powered device. Moreover, an appliance or electrically operated device need not be connected to a safety ground wire, or to a safety grounding conductor 34 of an electrical outlet, in order to operate. Electrical appliances function in a normal manner without such a connection.

Safety ground connectors only carry current if an unsafe, abnormal ground fault exists in the electrical distribution system, or in an electrical device connected to the system. Thus, ground fault interrupters are known devices which sense current flow in the ground connector to interrupt current flow in the ac terminals, in order to avoid a hazardous condition.

Based on the foregoing, the following description identifies various difficulties of the prior art and the solutions therefor provided by the present invention.

Electrically-powered devices operating without an E-field shield always emit electric fields of varying magnitudes when energized with AC power. When a device is connected to a 100 volt AC power source, for example, such fields may have intensities exceeding 100 volts per meter, when measured-under non-perturbed or "free field" conditions. Inasmuch as such E-fields induce currents in the bodies of nearby persons, it is desirable to avoid exposures of humans to high levels of ELF and VLF E-fields since such exposures can, under certain conditions, induce biological changes or effects.

Moreover, unshielded devices with non-polarized plugs or connectors, wherein either conductor of the appliance may be connected to the AC source connector 30 and either may be connected to neutral connector 32, have a 50% probability of emitting strong electric fields even when in an "OFF" condition and not operating. In a similar manner, unshielded devices having polarized connectors, but having non-polarized intermediate connectors, also can generate E-field emissions when the devices are in an "OFF" condition if the power switch, which is normally single-pole, is in series with the wire connected to the neutral connection 32 of an outlet by the intermediate connectors.

As will be appreciated by persons of ordinary skill in the electrical arts, both a non-polarized connector for connection to an AC outlet and a non-polarized intermediate connector may place the control switch for a device on the neutral line. Thus, even when the switch is open, the AC source connection provided at receptacle 30 is often connected to a conductor of the device, resulting in E-field generation even when the device is "OFF".

Unfortunately, such non-polarized plugs and intermediate connectors, which can be connected to a mating electrical receptacle in either of two different physical orientations, are used on a large number of electrical devices and appliances.

There is thus a need in the prior art for E-field shielding devices for ungrounded appliances.

There is a further need in the prior art for devices to prevent generation of E-fields by appliances having non-polarized plugs or intermediate connectors, and particularly to prevent generation of such E-fields when the appliance is in an "OFF" condition.

There is a more particular need for E-field shields for electrically heated bed coverings and other appliances precluded from having a ground connection.

DISCLOSURE OF INVENTION

It is accordingly an object of the present invention to overcome the deficiencies of the prior art and to provide E-field shielding for ungrounded electrically powered appliances and devices.

It is a more particular object of the invention to provide apparatus and connection for shielding electrical appliances and devices that otherwise would generate strong E-fields while using only a polarized two blade connector to connect an appliance or device to a source of AC electrical power.

It is a more specific object of the invention to provide E-field shielding apparatus for ungrounded appliances or devices wherein a shield component is connected to a neutral, or return, connector of an AC power distribution system.

It is yet another object of the invention to provide E-field shielding apparatus for ungrounded appliances or devices wherein the shield is positioned between a user of the device and an E-field generating part of the device, at least partially obstructing E-field emanations from an electrical conductor in the appliances.

It is still another object of the invention to provide E-field shielding apparatus for ungrounded appliances or devices wherein the shield fully surrounds an electrical conductor.

It is a further object of the invention to provide an E-field shielding apparatus for ungrounded appliances or devices, including an electrical conductor to shield a user from an E-field generated by the appliance and further including insulation surrounding the electrically conductive shield.

It is a more particular object of the invention to provide an E-field shielding apparatus for ungrounded appliances or devices, including only a polarized two blade connector to connect an appliance or device to a source of AC electrical power, and further including a polarized intermediate connector for electrical connections between the appliance or device and the two blade connector.

It is yet another object of the invention to provide an E-field shielding apparatus for ungrounded appliances or devices, including only a polarized two blade connector to connect an appliance or device to a source of AC electrical power, and further including a double pole switch for controlling electrical power supplied to the electrical device.

It is a more specific object of the invention to provide an E-field shielding apparatus for ungrounded applicances or devices, such as electrical bed coverings, heating pads, waterbed heaters, video display terminals and television receivers, in which a shield component is connected to a neutral, or return, connector of an AC power distribution system.

It is still another object of the invention to provide an E-field shielding apparatus in which a shield component is connected to a neutral, or return, connector of an AC power distribution system, and which includes current limiting means, for limiting current flow from the shield to an object in contact therewith, by limiting current flow between the neutral connector and the shield.

In accordance with the invention, there is provided an improved E-field shield apparatus for an ungrounded electrical device, including an electrically conductive shield for shielding at least one electrical conductor associated with the electrical device, a polarized connecting means, or plug, for connecting two electrical conductors of the electrical device to an electrical outlet, the polarized connecting means including a polarized electrical connector having only two connectors for connection to the electrical outlet; a first connector of the polarized electrical connector, such as a first blade, connected to a source of AC power connected to one connector of the electrical outlet; a second connector of the polarized electrical connector, such as a second blade, connected to an AC neutral return wire connected to another connector of the electrical outlet; the first and second connectors polarized for connection only to the one and another connectors of the electrical connector, respectively, such as by provision of different physical shapes or sizes thereto.

The shield may be positioned between a user of the device and an E-field generating part of the device, or may fully surround at least one electrical conductor of the device.

Preferably, insulation surrounds the electrically conductive shield.

The polarized connecting means may further include a two conductor electrical cable connected at one end to the polarized electrical connector, and a second, intermediate polarized connector connected between the two electrical conductors of the electrical device and the two conductor electrical cable.

Moreover, in accordance with the invention, a double pole switch may be used for controlling supply of electrical power to the electrical device, the double pole switch connected to the two conductor electrical cable for disconnecting both electrical conductors of the electrical device from electrical power, thereby eliminating a potential source of E-field radiation. Such a double pole switch may be a double-pole-single-throw switch.

In accordance with the invention, such E-field shielding structures may be used with electrically heated bed coverings, double insulated appliances, and other devices which either do not have, or are precluded from having, a separate ground connection.

The invention thus provides an E-field shielding apparatus for ungrounded applicances or devices, such as electrical bed coverings, heating pads, waterbed heaters, video display terminals and television receivers, in which a shield is connected to a neutral, or return, connector of an AC power distribution system.

In accordance with another aspect of the invention, there is provided an E-field shielding apparatus in which a shield is connected to a neutral, or return, connector of an AC power distribution system, and which further includes a current limiting device for limiting current flow from the shield to an object in contact therewith, by limiting current flow between the neutral connector and the shield. Such a current limiting device may include a resistor between the shield and the neutral connector or may include a current sensing circuit for sensing flow of current between the shield and the AC neutral return wire, and a blocking device for blocking flow of such current upon determining that the sensed current has a magnitude in excess of a predetermined threshold value.

These and other objects, features and advantages of the present invention will become readily apparent to those skilled in the art from the following description and drawings, wherein there is shown and described a preferred embodiment of the invention, simply by way of illustration and not of limitation of one of the best modes (and alternative embodiments) suited to carry out the invention. The invention itself is set forth in the claims appended hereto. As will be realized upon examination of the specification and drawings and from practice of the same, the present invention is capable of still other, different, embodiments and its several details are capable of modifications in various obvious aspects, all without departing from the scope of the invention as recited in the claims. Accordingly, the drawings and the descriptions provided herein are to be regarded as illustrative in nature and not as restrictive of the invention.

BRIEF DESCRIPTION OF THE DRAWINGS

The accompanying drawings, incorporated into and forming a part of the specification, illustrate several aspects of a preferred embodiment of the present invention and, together with the description, serve to explain the principles of the invention. In the drawings:

FIG. 1 shows one embodiment of the invention;

FIG. 2 shows another embodiment of the invention;

FIGS. 5(a)–5(c) show various experimental configurations used to verify advantages of the invention;

BEST MODE FOR CARRYING OUT THE INVENTION

Figure 3:
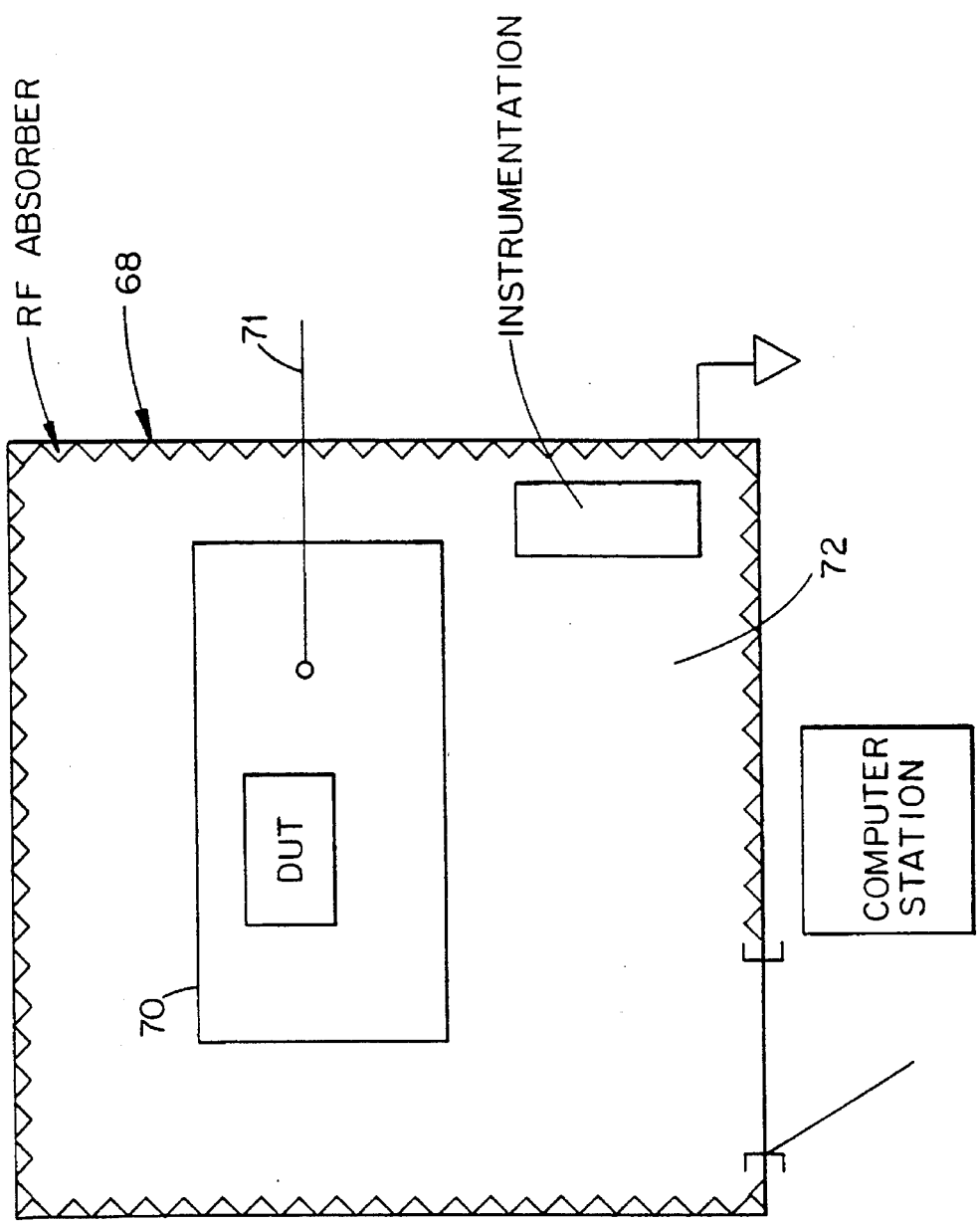
FIG. 3 is a top view of a laboratory arrangement for conducting an experimental procedure on the invention.

In accordance with the objects and features of the invention, there is provided an apparatus for containing E-fields generated by AC powered electrical devices. The types of shielding conductors incorporated in the inventive arrangement may include structures (faraday cages, coaxial cables, multiconductor shielded cables and shielding plates and the like) hereinabove described with reference to the prior art. However, unlike the prior art, the shielding conductors are connected to the neutral line of the AC power distribution system, rather than to safety ground.

Referring now to the drawings, there is shown in FIG. 1 an E shield system for an appliance (or device) 40. An E-field shield 42 is separated from appliance 40 by an inner insulation 44. Shield 42 is electrically conductive, and surrounds the appliance 40 which would otherwise emit electric fields, if not shielded. Similarly to known shield structures, shield 42 is composed of a material having sufficiently high electrical conductivity to enable the shield to perform its intended shielding function. The minimum acceptable conductivity depends upon the specific design of the shield and the nature of the appliance being shielded. Inasmuch as techniques for selecting such shields are known in the prior art, it is not necessary to repeat the same herein.

A requirement of the inventive shield structure is the provision of insulation to cover all surfaces of E-field shield 42. Thus, there is provided an insulated outer shell 46. In accordance with the invention, all surfaces of the shield which could be exposed to electrically conductive objects, inside or outside the shield, are covered by insulation in order to provide protection from electrical shocks and to prevent short circuits or electrical malfunctions. Thus, protection is provided from malfunctions which could injure persons, or damage objects, coming into contact with the shield when the shielded appliance is energized. It will be appreciated that the insulation 44, 46 further protects the shielded appliance from electrical short circuits.

In order to connect the E-field shield to the neutral conductor of an AC electrical outlet, the inventive structure provides a polarized two connector plug 48. It is noted that the shield 42 is connected to the same AC electrical outlet used to provide the appliance 40 with most or all of the AC power consumed thereby. Indeed, because of electrical safety, or other protective standards or requirements, connection of the shield to safety ground is excluded by the inventive structure which uses only a two conductor connector for connection to the AC outlet.

This manner of connecting the E-field shield to the AC outlet is an indirect connection, which connects the shield to the neutral, rather than the ground, contact of the AC outlet. Thus, plug 48 is provided with two blades 49a, 49b for connecting a power cable 51 of the shielded appliance to the source of AC power. Polarized plugs are known, and will not be described in detail other than to mention that such plugs have a physical asymmetry between the two blades of the plug to permit connection to an outlet in only one orientation.

As also shown in FIG. 1, a second polarized plug 50 is used to connect the power cable 51 to the appliance 40. Thus, regardless of the manner in which the shield 42 is connected to the neutral blade of plug 48, appliance 40 is connected to the conductors of the electrical outlet in only one manner, to avoid unintended generation of E-field in an OFF state. By requiring any intermediate electrical power connectors (such as cable 51 and other control cables) to be polarized, the inventive structure ensures that a proper connection exists between the E-field shield and the neutral point of the electrical power distribution system. If non-polarized intermediate plugs were used, an incorrect connection could occur.

Yet another feature of the invention, which further assures that an E-field will not be generated in an OFF state of the appliance, provides a double-pole switch 52 in the cable 51 connecting the polarized connector 50 to polarized plug 48 and thus to the AC power source. By providing a double pole switch 52 to control supply of electrical power to appliance 40, the invention assures that both conductors of the appliance are disconnected from AC power when the control switch 52 turns the appliance OFF.

Accordingly, even if the polarized plugs are mis-wired, no electrical power is supplied to the conductors of the appliance in the OFF state and no E-field is generated in the OFF state.

Referring now to FIG. 2, in an E-field shield for electrically heated bed covering elements there is shown an electrical heating element 54 surrounded by a conductive foil (or similar structure) acting as a multiconductor E-field shield 56. The heating element 54 is electrically connected to polarized plug 48 via an intermediate polarized female connector 58 and an intermediate polarized plug 50. A double pole ON/OFF switch 52 is provided for controlling heating of the bed covering element by application of AC electrical power to heating element 54. As seen in FIG. 2, the insulated shield 56 is connected to the neutral connector by a connection 60, with intermediate connections which may be provided through female connector 58, plug 50, and switch 52.

Still another feature of the invention is provision of a current limiting device between the E-field shield and the neutral receptacle of the AC power distribution system. Such current limiting ensures that the maximum possible current flowing from the E-field shield to any other object making unexpected or undesirable electrical contact with the shield will not exceed a specific amount. Indeed, the maximum amount can be limited to a specific value which does not exceed the minimum current known to produce acute harmful effects in humans, or other values chosen for other reasons. Since undesired electrical contact between a person's body and the E-field shield may occur even for insulated shields, as when flaws occur in the insulation, or when conducting objects puncture the insulation, such current limitation is a significant advantage of the invention.

Various current limiting devices may be used with the inventive E-field shield structure to provide the advantageous fail-safe feature of the invention. For example, a single discrete resistor may be placed in series with the connection between the E-field shield and the neutral blade of the AC power plug. Such a resistor is symbolized by resistor 62 in FIG. 2.

Alternatively, a distributed resistance may be used instead of the discrete resistor. Such distributed resistance may be provided by using electrically resistive material to form a portion of the shield, or to form the conductor connecting the shield to the neutral blade of the AC plug 48, such as the conductor 60 for example. In that regard, in FIG. 1 there is symbolically shown a resistance 64, representing a current limiting distributed resistance of the shield material.

Still other forms of current limiting may be used. For example, an electronic device or component, such as a transistor circuit, fuse, nonlinear resistor or circuit breaker may be placed in series with the connection between the E-field shield and the neutral blade of the AC plug 48. Similarly, a sensor could be positioned in connection line 60 and be used to detect (and switch off) excessive currents flowing in connection line 60 to shield 56.

Still another electronic circuit may be used to disrupt or halt current flow to the electrically powered appliance, by monitoring the current in the supply conductor to the appliance and monitoring the current in the return conductor to neutral. If the magnitudes of the two currents are not equal, the circuit interrupts the flow of current from AC power supply to the appliance. Ground fault interrupters functioning in this manner are known and, accordingly, description thereof may be omitted herein. In the present instance, unequal current flow is indicative of an undesirable fault condition, wherein current must be flowing from the device or the E-field shield through a person, or other external conducting object, to another point in the AC power system. Current limiting under such circumstances is effectively achieved by interrupting current flow in a known manner. A current sensing ground fault interrupter is symbolized in FIG. 1 by a circuit breaker reset button 65.

Thus, the present invention can utilize a known principle, similar to ground fault interruption, in an ungrounded circuit which is not connected to ground.

In order to verify and confirm that the inventive E-field shield is effective at shielding an electric field, a number of experiments were undertaken. The results of the experiments are set forth as follows.

EXPERIMENTAL RESULTS

I. Electric Blankets

A prototype electric blanket with an E-field shield was constructed by the inventors using the disclosed arrangement of the present invention and standard positive temperature coefficient (PTC) electric blanket heating wire. The PTC heating wire was composed of a pair of metallic conductors arranged in a parallel configuration. Each conductor in the PTC wire was enclosed with a plastic material which is electrically resistive in order to generate heat when electric current is passed through it. At every point along the length of the wire, the resistance of the plastic increases in proportion to the temperature of that segment of the wire, thus producing automatic, localized temperature control throughout the length of the wire. The PTC heating wire was coated with an electrically-insulating material.

A measurement laboratory (FIG. 3) was fabricated by the inventors to evaluate ELF electric fields emitted from electric blankets and other electronic products. E-field measurements were performed in a fully RF shielded room 72 with all walls, the floor and the ceiling covered with aluminum foil sheets 68 that were electrically connected together at all edges. As shown in FIG. 3, the room's shielding was connected directly to the AC power system's safety ground. An all-wooden platform 70 was constructed and placed in the center of the room, with its broad surface parallel to the floor. The platform was 94 cm above the conducting, grounded floor. The conducting floor served as a reference ground plane for E-field measurements, which were made on DUT (devices under test) placed on the platform. A separate, conductive plate with dimensions of 122×244 cm was placed 100 cm above the platform and parallel to the surface of the platform. Guard rings were installed along the peripheral space between the two platforms to provide an equipotential surface to reduce fringing along the edges of the measurement area. This upper plate was connected directly to the AC safety ground. The upper plate served as a second "upper reference ground plane" which was used to enable E-field measurements to be made above objects that were placed on the platform. The upper ground plane ensured that a set of constant electrical boundary conditions existed for E-fields emitted from the top surface of the electric blanket under test. Electric-fields emitted by the blankets were measured using a special miniature probe 71 with a fiber-optic data link. The fiber optics are electrically non-conducting and did not alter the field being measured. This "non-perturbing" E-field probe 71 was evaluated and calibrated precisely by electromagnetic field measurement experts at the National Institute of Standards and Technology (NIST).

Measurements were made of E-field emissions from commercially-available (conventional) blankets using the measurement facility of FIG. 3 described above. A 10 cm×10 cm or smaller registration grid was stitched with polyester thread, onto the surface of the blanket shell over the heating element area. The maximum value of the field found within each square of the registration grid was recorded. The numerical average of all of the data points for each individual blanket was calculated to obtain the "spatially averaged" value of the magnetic or electric field emission for the blanket. In addition, the highest single value within the data set was reported as the "spatial peak" value for that blanket. The non-perturbing electric field probe 71 was positioned 5 cm above the surface of the blanket under test. The probe's sensor was aligned with the electric field vector to enable the true electric field strength to be measured.

Figure 4:
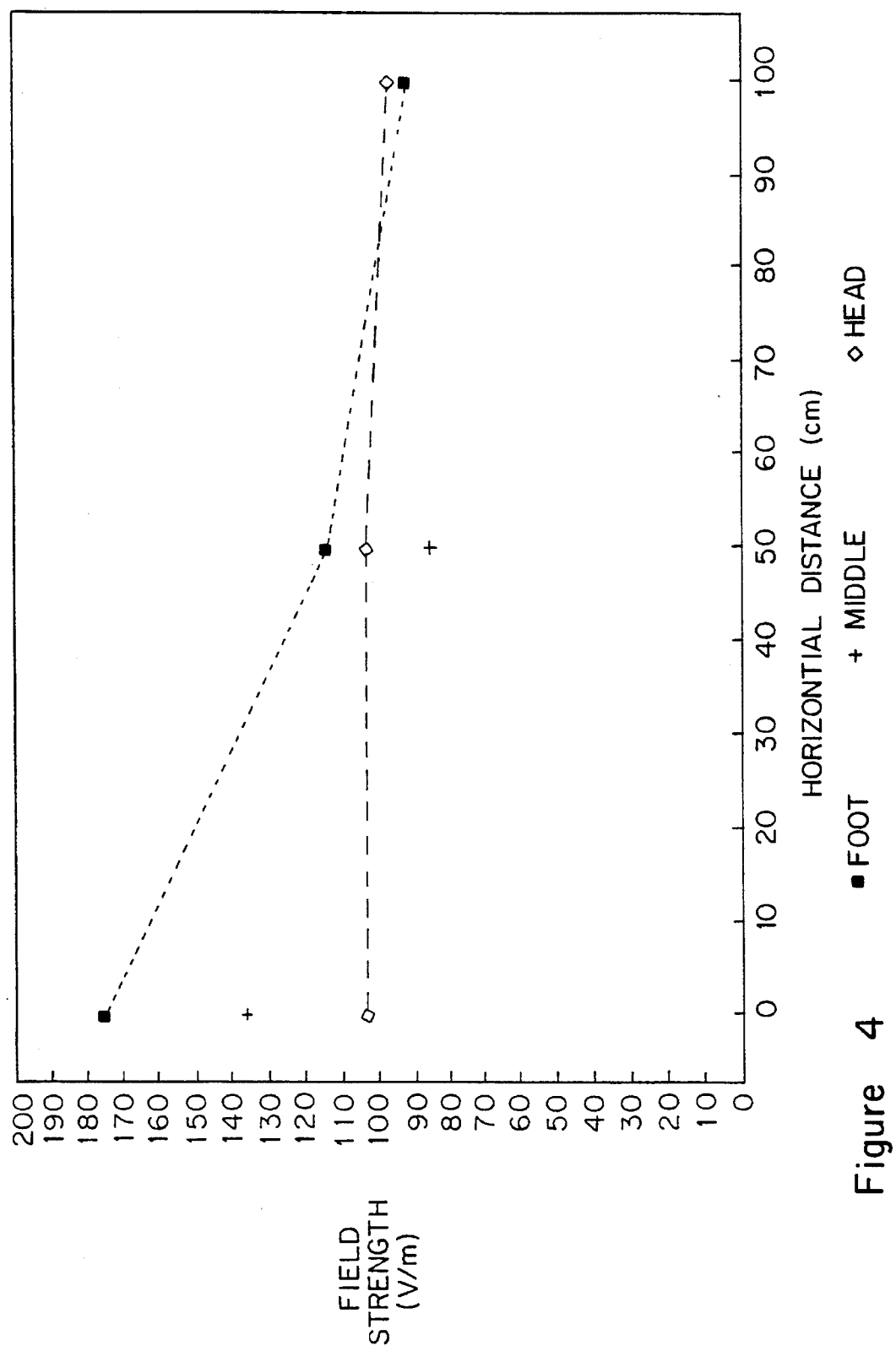
FIG. 4 shows experimental data obtained for a particular experiment conducted using the arrangement of FIG. 3.
Figure 6:
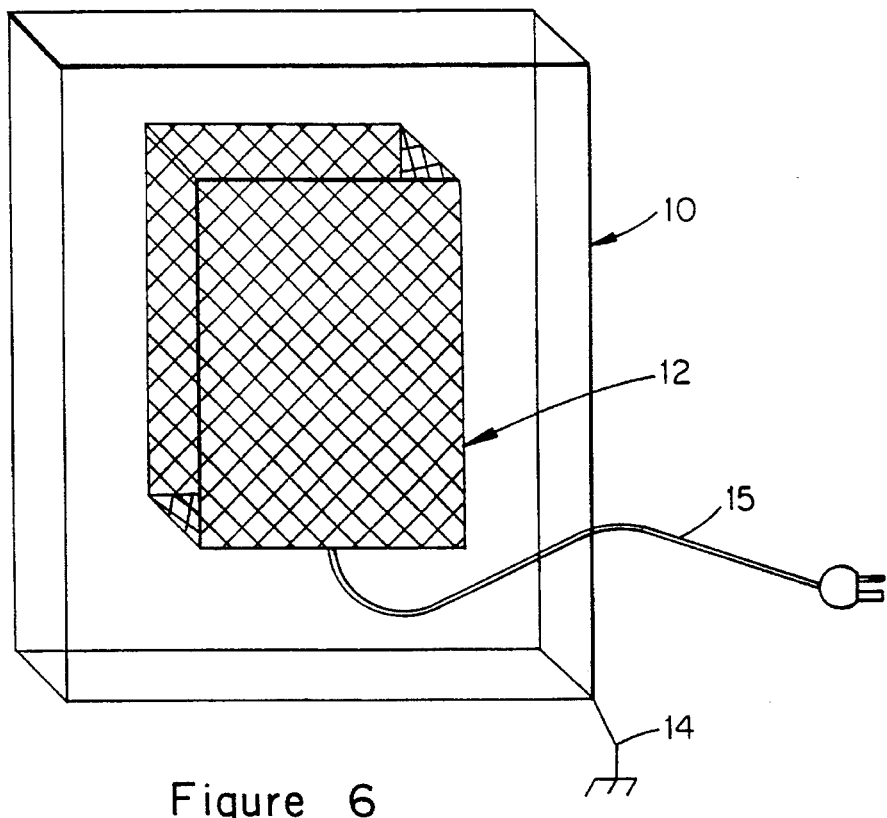
FIG. 6 shows a prior art grounded E-field shield including a faraday cage.
Figure 7:
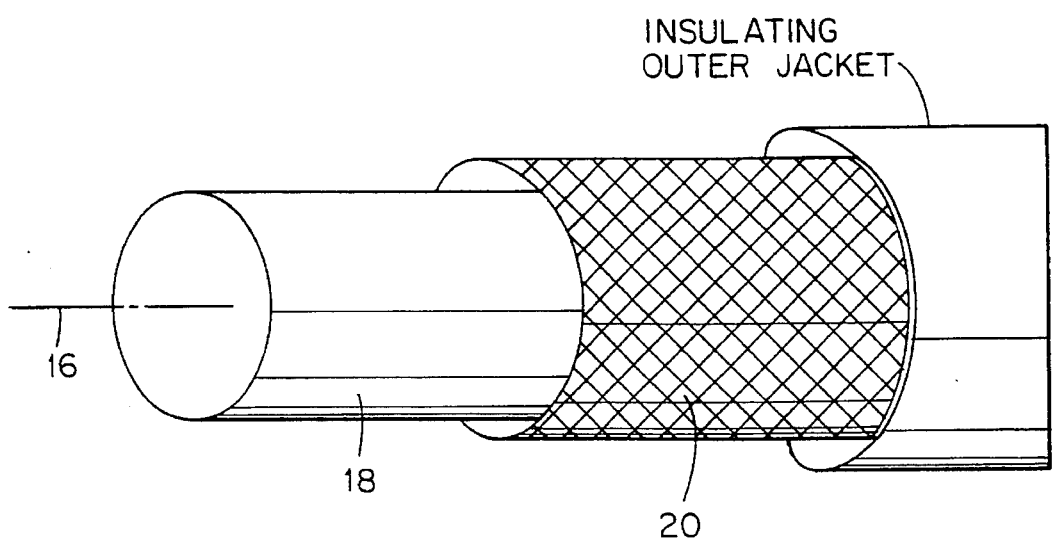
FIG. 7 shows a prior art grounded coaxial shield acting as an E-field shield for an inner conductor.
Figure 8:
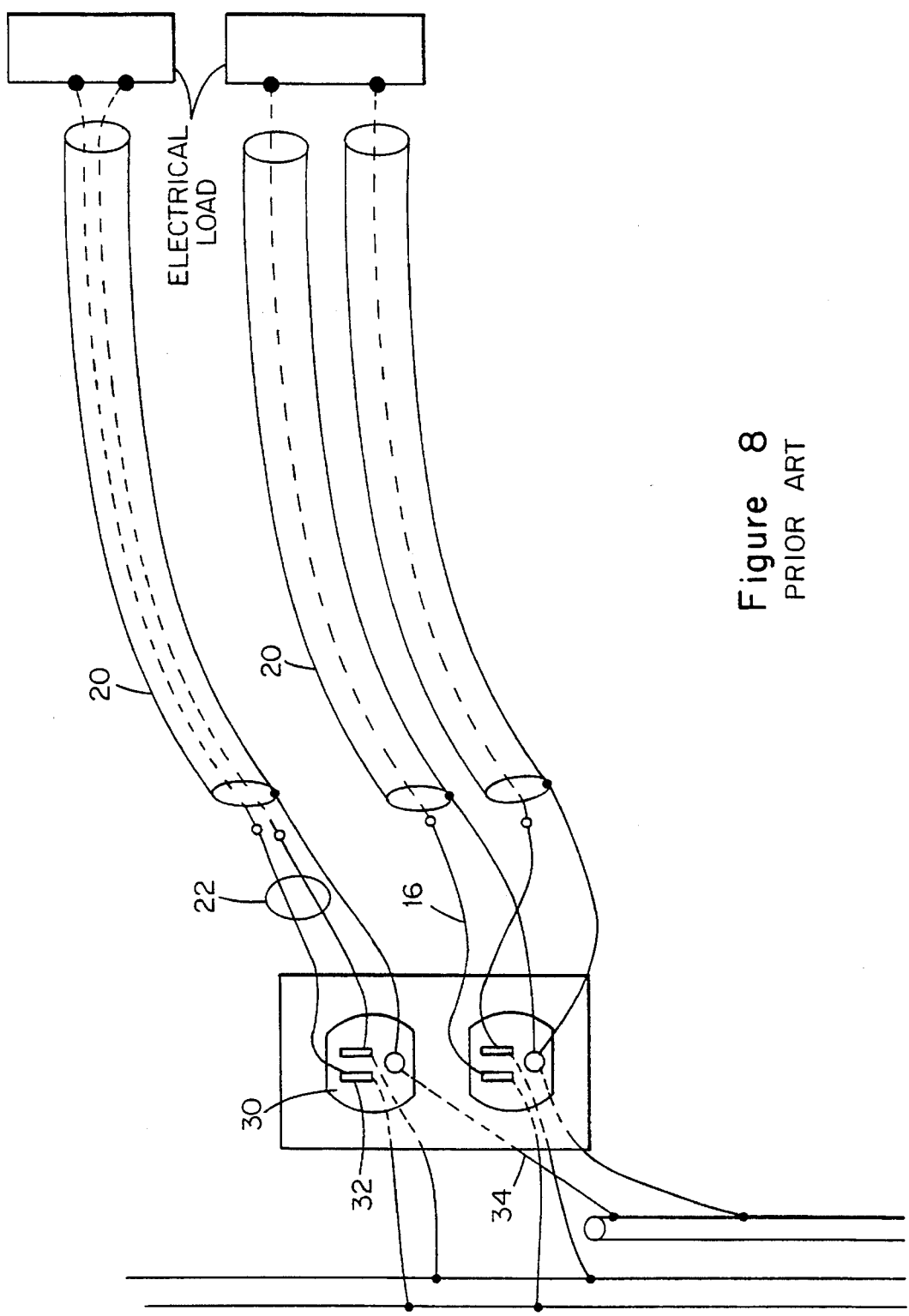
FIG. 8 shows a prior art grounded E-field shield including a multi wire shield for a plurality of inner conductors.
Figure 10:
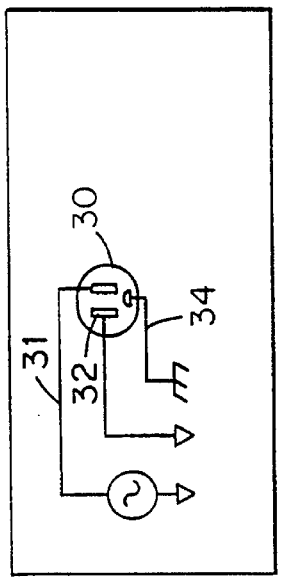
FIG. 10 shows a standard configuration for an AC electrical socket and a polarized two blade connector.

All commercially-available electric blankets that were tested were found to emit a spatial maximum electric-field strength which exceeded 90 V/m (under optimum conditions; i.e., with the electric plugs and connectors oriented in such a way to minimize the electric field emissions). The local maximum E-field varied from 16 to 284 Volts per meter (V/m). The local peak electric-field strengths emitted from a blanket with PTC heating wire ranged from 172 V/m to 100 V/m over most of the blanket. The spatially averaged value of these local maximum E-fields was 120 V/m. The spatial distribution of the maximum local E-field emitted from a commercially available blanket with PTC heating wire is shown in FIG. 4.

A simulated blanket test unit was fabricated. This unit was used as a standardized test object to which various E-field shielding techniques could be applied, as shown in FIGS. 5a-5c. The basic unit consisted of a two meter length of dual-conductor PTC heating wire 74 which was obtained from an electric blanket manufacturer. This length of heating wire was routed over the broad flat, surface of a wooden test platform in the configuration shown in FIG. 5a. This configuration consisted of a straight section and a curved. The spacing between the elements of adjacent conductors was about 6 cm. The shape and size of the heating wire configuration in the simulated electric blanket were made very similar to the configuration of a commercially-available electric blanket that uses PTC heating wire. The simulated blanket test unit was energized with 120 Volts of 60 Hz AC power from the electrical power distribution system. The test unit drew 350 mA of current from the power distributions system.

Two types of experimental E-field shields were tested in conjunction with the simulated blanket test unit. Each shield was connected to the various grounding points in the AC power distribution system by a switch 76 (FIG. 5c), in the manner described below. For each shield, several values of current-limiting resistors 78 were placed individually in series with the wire connecting the shield to the electrical ground reference point. Each shield was placed around or over the simulated blanket, and a single measurement was taken for each shielding arrangement. This measurement was always taken at the same "test measurement point" which was 5 cm above the particular shield which was being evaluated. This measurement point was 40 cm from the serpentine loop at the end of the heating wire that was furthest from the AC plug (see FIG. 5a). It was not necessary to make more than one measurement of the E-field emitted by each experimental combination of a shield and a current-limiting resistor. All of the E-field shields which were evaluated constituted an "equipotential surface". This equipotential surface established a constant E-field strength at all points along the length of the shield, when measured as follows. The distance of the non-perturbing probe 71 was always 5 cm from the shield, and the measurement system was always used under the same controlled conditions in terms of the location of ground planes below and above the simulated blanket. Therefore, only one measurement was needed for each shield/resistor combination to enable an accurate determination of the E-field strength emitted by the shielded blanket under test.

Case a) SIMULATED BLANKET TEST UNIT WITHOUT AN E-FIELD SHIELD.

The E-field emitted by the unshielded, simulated blanket was measured at a distance of 5 cm from the "test measurement point" described above (FIG. 5a). This data point served as a reference value to which all other E-field measurements were compared. At this location, the E-field was 108 V/m.

Case b) SIMULATED BLANKET WITH AN E-FIELD SHIELDING PLATE

One of the shielding methods that was evaluated was the electric-field shielding plate. A prototype of this design was constructed using a 46 cm (18 inch) wide sheet 80 of aluminum foil. The foil sheet 80 was made large enough to cover the entire area of the underlying, insulated heating-wire elements of the simulated blanket (FIG. 5b). The simulated blanket was covered with the E-field shielding plate described above. Several different current-limiting resistors 78 were individually connected in electrical series between the shield and the NEUTRAL receptacle 32 of the AC power outlet 30. A summary of electric field strengths measured under the conditions stated above are indicated in Table 1.

TABLE 1

VALUES OF THE LOCAL MAXIMUM
E-FIELDS FROM A TEST UNIT
INCORPORATING A GROUND-REFERENCED
E-FIELD SHIELDING PLATE

| Current-Limiting Resistor Shield from AC NEUTRAL (MΩ) | E-Field Strength (V/M) | E-Field Percent Reduction* (%) |
| --- | --- | --- |
| OPEN Circuit (No Connection to Grounding Point) | 53.9 | 49.9% |
| 12 | 36.3 | 66.3% |
| 10 | 12.5 | 88.4% |
| 0 | 1.5 | 98.6% |
| SHORT Circuit | | |
| NO Shield | 108 | — |

NOTES:
*Percent of E-field reduction is compared to the case with no shield. The shielding plate is connected to the NEUTRAL receptacle of AC outlet.
For all cases:
Currents in Heating wire = 350 mA
Currents in shield to neutral wire were less than 0.1 mA Data for E-field emissions vs. shielding parameters for the simulated blanket with shielding plate. The plate was connected to the neutral wire of the AC power distribution system with a current limiting resistor. E-field values equal the E-field for each case at the selected representative point above the simulated blanket.

Case c) SIMULATED BLANKET TEST UNIT WITH A MULTICONDUCTOR E-FIELD SHIELD.

A second shielding method that was evaluated was the multiconductor shield. An experimental prototype was fabricated, in conjunction with the simulated blanket as follows. Aluminum foil 82 was wrapped directly around the insulated PTC heating wire, along its entire length. Several values of current-limiting resistors 78 were placed individually in series with the wire connecting the shield to the electrical ground reference point (FIG. 5c). The E-field that was emitted by the simulated blanket, when surrounded with a multiconductor E-field shield, was measured for each of several grounding configurations of the current-limiting resistor 78. These configurations consisted of combinations of the shield connected electrically to one of two different grounding points at an electrical power outlet 30 by a switch 76. The two grounding points used included the NEUTRAL receptacle 32 and the safety GROUND 34 of the electrical outlet which supplied AC power to the simulated blanket. In addition, for each grounding point, one of several current-limiting resistors 78 was placed in series with the connection to the grounding point. The E-field strength was measured at the test measurement point for each combination of grounding point and resistor. Results of these measurements are indicated in Table 2. The maximum current that the resistor would allow to pass for the worst-case fault condition is listed in Table 3. The worst case fault occurs when the current-limiting resistor 78 is connected to the energized (HOT) receptacle for AC source 31 instead of to AC NEUTRAL, and a conductive object electrically contacts both the shield and the electrical system safety GROUND.

electrical contact with both the shield and with the electrical system's ground.

CONCLUSIONS

From the foregoing experiments it was concluded that a significant decrease in the strength of electric-fields emitted from electric blankets can be achieved using the shielding techniques described in this invention disclosure. The reduction of emissions is significant for both the case in which the shield is connected to the safety GROUND of the AC electrical outlet, or the case in which the shield is connected to the NEUTRAL receptacle of the AC electrical outlet. In addition, it has been demonstrated that the reduction of E-field emissions is relatively unchanged from the cases above when the shield is connected to the AC NEUTRAL receptacle through a current-limiting resistor. The resistor's value can be sufficiently high to restrict current from shield to a grounded object, should a fault condition occur.

TABLE 2

E-FIELD EMISSIONS FROM A SIMULATED BLANKET WITH A MULTICONDUCTOR E-FIELD SHIELD AND A CURRENT-LIMITING RESISTOR

| Current-Limiting Resistor Value (MΩ) | Shield to NEUTRAL E-Field Strength (V/m) | Shield to NEUTRAL E-Field Reduction* (%) | Shield to Safety GROUND E-Field Strength (V/m) | Shield to Safety GROUND E-Field Reduction* (%) |
|---|---|---|---|---|
| OPEN Circuit | 136.0 | −26.4% | 136.4% | −26.4% |
| 12 | 94.6 | 12.1% | 94.6 | 12.1% |
| 1.2 | 14.3 | 86.7% | 14.3 | 86.7% |
| 0.12 | 4.4 | 95.9% | 3.3 | 96.9% |
| 0 | 2.2 | 98.0 | 4.0 | 96.3% |
| SHORT Circuit | | | | |
| NO Shield (Reference Case) | 108 | — | — | — |

NOTES:
*Percent of E-field reduction is compared to the case with no shield.
For all cases:
Currents in Heating wire = 350 mA.
Currents in grounding wire were less than 1.12 mA.
Data for E-field emissions vs. shielding parameters for a simulated blanket with multiconductor shield.

The current-limiting resistor was connected to the shield and to the energized AC electrical RETURN and Safety GROUND at the receptacle. E-field values equal the local maximum of the E-field at the selected representative point on the simulated blanket.

TABLE 3

WORST-CASE FAULT CURRENT TEST FOR A SIMULATED BLANKET WITH A MULTICONDUCTOR E-FIELD SHIELD.

| Current-Limiting Resistor (MΩ) | Measured Current (milliampers) |
|---|---|
| 12 | 0.02 |
| 1.2 | 0.10 |
| 0.12 | 1.12 |

The amount of current flowing from the E-field shield through a current-limiting resistor, to electrical ground was measured. The shield is connected to the AC HOT receptacle instead of AC NEUTRAL, and a conductive object is in The fault condition of concern is an accidental situation which could occur if an external conducting object (such as a metal safety pin) were to make direct electrical contact with the electric-field shield, and would allow a potentially harmful AC line voltage to be accessible to external objects. Normally, this AC voltage would create a hazard due to the possibility of producing an electrical shock for a person who touched the object that was in contact with the shield. The maximum current that flowing through a person's body must be limited to value of less than 5 mA. This "maximum safe value" is defined in existing United States electric blanket safety standards (Underwriter Laboratories, 1988).

A fire hazard could also exist under the above "fault conditions". The fire hazard would occur if an external conducting object (such as a safety pin) were to come into contact with both the energized shield and an adjacent, electrically conducting object that was also connected to the AC electrical system's ground. Under these conditions a short circuit would exist, and large currents would flow through the blanket's electrical cables and the external, grounded conducting object. These currents could create enough heat in the conducting wires and objects to create a fire. The current-limiting resistor can eliminate the fire hazard situation by eliminating the possibility that the current would exceed a value that would be insufficient to cause heating of the conducting objects.

An additional finding was discovered during the measurements made by the inventors hereof. The highest electric-field emissions for certain blankets occurred when a unshielded blanket was not generating heat, but remained connected to the electrical power distribution system. This high-emission condition occurred under certain conditions for blankets whose electric power plug was non-polarized and allowed a random condition where the heater switch is connected to the electrical power distribution system's neutral wire instead of its HOT wire. The highest E-fields were emitted when either the blanket's AC power switch or the automatic heat controller was switched to "OFF" (not conducting electricity through the heating elements) for the following conditions.

1. An unpolarized electrical plug inserted into the electrical outlet in such a manner that the ON/OFF switch is electrically connected to the AC NEUTRAL line of the AC electrical outlet, resulting in the entire heating wire would be a AC line potential.
2. A polarized electrical plug inserted into a faulty (miss-wired) AC electrical outlet resulting in the condition where the AC HOT line of the AC house Wiring is connected to the AC NEUTRAL line of the electrical cord, resulting in the same conditions as the above case 1.
3. Polarized electrical plug inserted into a faulty (miss-wired) AC extension cord socket (or non-polarized extension cord) resulting in the condition where the AC HOT line of the AC house wiring is connected to the AC NEUTRAL line of the electrical cord resulting in the same conditions as the above case 1.

II. Video Display Unit

Figure 9B:
FIGS. 9a and 9b show a prior art grounded E-field shield for a VDT and an experimental configuration used therewith.
Figure 9A:
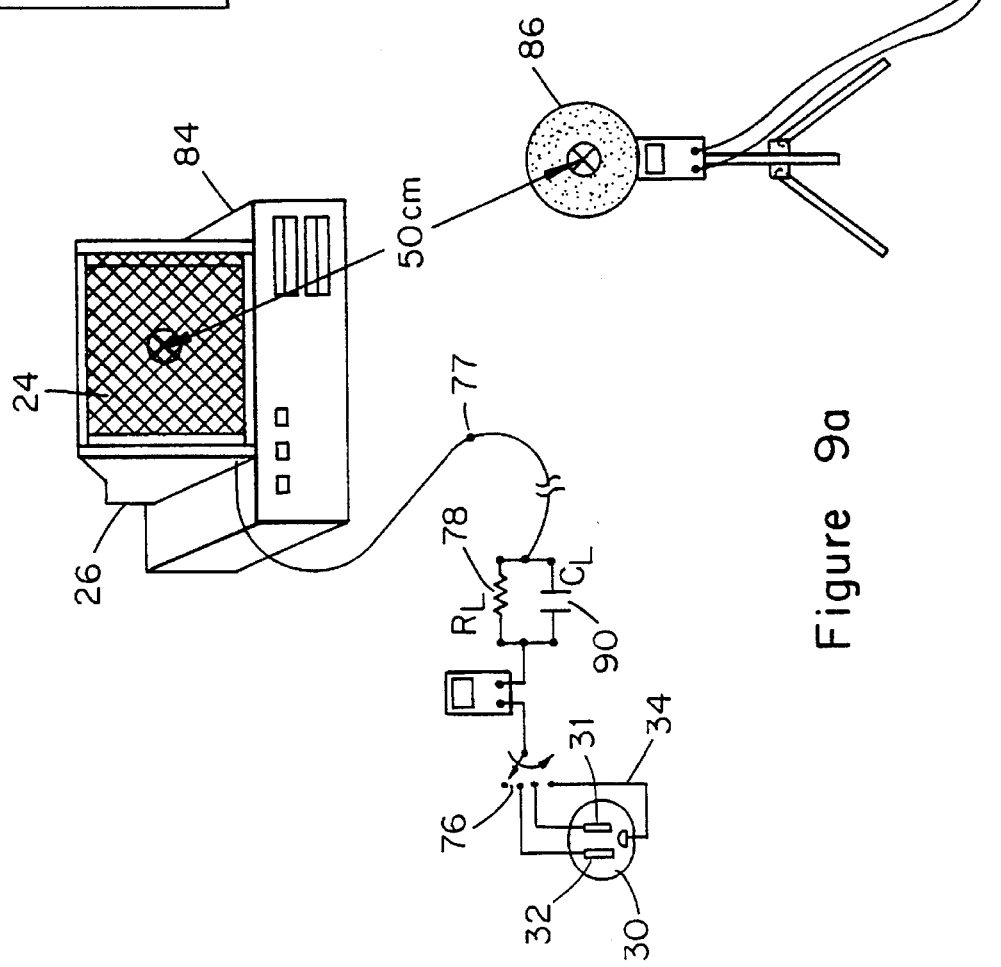

A computer video display terminal (VDT) 26 was used as a test device with a known ability to emit relatively high electric fields in its close proximity. The terminal under test was configured as a typical computer data display sitting atop a personal computer 84, as shown in FIG. 9a. A special E-field measurement instrument 86 (Holiday Industries model HI-3604) was used to measure the field strengths emitted from the VDT at a distance of 50 cm. A fiber-optically linked remote readout 88 (model HI-3636) was attached to the instrument 86 to measure E-fields without perturbation of the fields being measured due to the immediate presence of metallic cables and the person making the measurements. A computer program was written and run on the computer 84 to provide a continuous display of the character "H" on the VDT screen.

Measurements of the electric field strengths in the ELF range of 20 to 2000 HZ, were made without any E-field shielding installed.

A metal conducting screen 24, comprised of a mesh of copper wires, was positioned in front of the VDT display 26. This conducting screen formed an E-field shielding plate. In the prior are a direct connection 28 is made from the shield to the safety ground, as shown in FIG. 9b. In conducting the experiments hereinabove described, shield 24 was separately connected by experimental configuration 90, including switch 76, to various points in the AC electrical system that was providing power to the VDT. The shield 24 was sequentially connected to the points, and measurement of the E-field emissions was made as shown in FIG. 9a.

The connection points included the energized (HOT) AC electrical receptacle 31 of the AC power outlet 30, the AC NEUTRAL receptacle 32, and the system safety GROUND 34. E-field measurements were made in front of the VDT screen (where a person viewing the screen would normally be located). The measurements were made separately for each of the shield-to-electrical-system connections. In addition, a measurement was made with no connection from the shield to any portion of the electrical power system. For each shielding/grounding configuration, E-field emission measurements were made at the same location. For each different electrical connection point (NEUTRAL, HOT, and safety GROUND) various current-limiting resistors 78 were placed in electrical series with the connection. A capacitor with a value of 0.1 uF was placed in parallel with the resistor to provide a better discharge path for the shield. The E-field emission data are presented in Table 4.

TABLE 4

TABLE OF COMPARATIVE E-FIELDS IN BOTH ELF AND VLF FREQUENCY RANGES USING AN E-FIELD SHIELDING PLATE REFERENCED TO AC ELECTRICAL HOT, NEUTRAL, AND GROUND USING VARIOUS SIZED SAFETY RESISTORS, DIRECT CONNECTION, AND NO CONNECTION.
VLF/ELF VDT Electric-Field Shield with Safety Resistor

| Test Conditions/ Resistor (MΩ) | ELF E-Field (V/m) | ELF E-Field % Reduced* | VLF E-Field (V/m) | VLF E-Field % Reduced* |
| --- | --- | --- | --- | --- |
| Unshielded VDT/— | 14.2 | — | .92 | — |
| Shield Disconnected/— | 11.9 | 16.2% | 1.14 | −23.9% |
| Shield to HOT/0 | 64.9 | −357.0% | 0.16 | 82.6% |
| Shield to NEUTRAL/0 | 2.5 | 82.4% | 0.08 | 91.3% |
| Shield to Ground/0 | 1.5 | 89.4% | 0.06 | 93.5% |
| Shield with Resistor to GND/ | | | | |
| "/12. | 1.5 | 89.4% | 1.12 | −21.7% |
| "/1.2 | 1.5 | 89.4% | 1.12 | −21.7% |
| "/0.12 | 1.5 | 89.4% | 1.12 | −21.7% |
| "/0.012 | 1.5 | 89.4% | 0.56 | 39.1% |

TABLE 4-continued

TABLE OF COMPARATIVE E-FIELDS IN BOTH ELF AND VLF
FREQUENCY RANGES USING AN E-FIELD SHIELDING PLATE
REFERENCED TO AC ELECTRICAL HOT, NEUTRAL, AND GROUND
USING VARIOUS SIZED SAFETY RESISTORS, DIRECT CONNECTION,
AND NO CONNECTION.
VLF/ELF VDT Electric-Field Shield with Safety Resistor

| Test Conditions/ Resistor (MΩ) | ELF E-Field (V/m) | ELF E-Field % Reduced* | VLF E-Field (V/m) | VLF E-Field % Reduced* |
|---|---|---|---|---|
| Shield with Resistor to NEUTRAL/ | | | | |
| "/12. | 5.2 | 63.4% | 1.16 | −26.1% |
| "/1.2 | 2.5 | 82.4% | 1.16 | −26.1% |
| "/0.12 | 2.5 | 82.4% | 1.12 | −21.7% |
| "/0.012 | 2.5 | 82.4% | 0.58 | 37.0% |
| Shield with Resistor to HOT/ | | | | |
| "/12. | 64.8 | −356.4% | 1.12 | −21.7% |
| "/1.2 | 64.4 | −353.5% | 1.12 | −21.7% |
| "/0.12 | 64.8 | −356.4% | 1.12 | −21.7% |
| "/0.012 | 64.9 | −357.0% | 0.56 | 39.1% |

*Percent reduction as compared to the bare VDT without a shield.
(NOTE: Current limiting resistor = 0 ohms = Direct connection)

The data of Table 4 indicate that the present invention performs its intended function well. This shielding system provided a significant 82% reduction of E-field emissions from a VDT, when compared to the measured emissions from the same VDT without an E-field shield. The neutral receptacle of a standard AC electrical outlet was used as the ground for the shield. Only a two-blade polarized, AC plug was required to implement this shield-grounding technique. When a more complex, conventional grounding arrangement using the three-receptacle (Safety GROUND) of an AC outlet was used, the intensity of the E-field decreased only 7%, with respect to the present invention. For applications where three-wire safety ground connection is not allowed due to electrical safety regulations (as in a conventional "double-insulated" home television receiver), the present invention is a viable means for providing E-field reduction while using only a two-wire AC "power cord" to connect the AC-powered device to the electrical distribution system without requiring a special external grounding wire to be installed by the user. A current-limiting resistor provides fail-safe protection from electrical shock if a fault condition occurs, such a connection to an incorrectly-wired AC power outlet. An additional, high-frequency "bypass capacitor" (FIG. 9a) provides additional E-field shielding grounding to minimize higher frequency (VLF) emissions, without the need for ground connections other than through the two-wire AC connections using a two-blade, polarized plug.

Accordingly, there has been described a novel apparatus for shielding an E-field generated by an ungrounded appliance or device. The inventive apparatus provides a practical and safe means for reducing emission of electric fields significantly from electrically powered appliances or devices which have previously been unshielded. The advantage provides these results by using an E-field shield with electrical wiring and connectors which are completely compatible with all existing electrical distribution systems, including electric power outlets that cannot accept a three blade, safety grounded, plug. The new invention requires the use of only a two wire electrical cable and a polarized two blade plug to connect the device to the AC electrical power distribution system.

The foregoing description of the preferred embodiment of the invention has been presented for purposes of illustration and description. It is not intended to be exhaustive or to limit the invention to the precise forms disclosed, since many modifications or variations thereof are possible in light of the above teachings. All such modifications and variations are within the scope of the invention. The embodiments described herein were chosen and described in order best to explain the principles of the invention and its practical application, thereby to enable others skilled in the art to utilize the invention in various embodiments and with various modifications as are suited to the particular use contemplated therefor. It is intended that the scope of the invention be defined by the claims appended hereto, when interpreted in accordance with the full breadth to which they are legally and equitably entitled.

We claim:

1. An E-field shield apparatus for an ungrounded electrical device, comprising:

electrically conductive shield means for shielding at least one electrical conductor associated with the electrical device;

polarized connecting means for connecting two electrical conductors of the electrical device to an electrical outlet, said polarized connecting means including a polarized electrical connector having only two connectors for connection to the electrical outlet;

a first connector of said polarized electrical connector connected to a source of AC power connected to one connector of the electrical outlet;

a second connector of said polarized electrical connector connected to an AC neutral return wire connected to another connector of the electrical outlet;

said second connector connected to said electrically conductive shield means;

said first and second connectors polarized for connection only to the one and another connectors of the electrical connector, respectively.

2. An apparatus as recited in claim 1 wherein said shield means is positioned between a user of the device and an E-field generating part of the device.

3. An apparatus as recited in claim 1 wherein said shield means surrounds the at least one electrical conductor.

4. An apparatus as recited in claim 1 wherein said electrically conductive shield means comprises a combination of conductive wire and foil.

5. An apparatus as recited in claim 1 wherein said electrically conductive shield means comprises a braided wire.

6. An apparatus as recited in claim 5 further comprising insulation surrounding said braided wire.

7. An apparatus as recited in claim 4 further comprising insulation surrounding said combination of conductive wire and foil.

8. An apparatus as recited in claim 1 further comprising insulation surrounding said electrically conductive shield means.

9. An apparatus as recited in claim 8, wherein said polarized connecting means further includes:

a two conductor electrical cable connected at one end to said polarized electrical connector; and a second polarized connector connected between the two electrical conductors of the electrical device and said two conductor electrical cable.

10. An apparatus as recited in claim 1, wherein said polarized connecting means further includes:

a two conductor electrical cable connected at one end to said polarized electrical connector; and a second polarized connector connected between the two electrical conductors of the electrical device and said two conductor electrical cable.

11. An apparatus as recited in claim 10, further comprising a double pole switch for controlling supply of electrical power to the electrical device, said double pole switch connected to said two conductor electrical cable for disconnecting both electrical conductors of the electrical device from electrical power thereby eliminating a potential source of E-field radiation.

12. An apparatus as recited in claim 11, wherein said double pole switch is a double-pole-single-throw switch.

13. An apparatus as recited in claim 1, wherein said polarized connecting means further includes:

a two conductor electrical cable connected at one end to said polarized electrical connector; and further comprising a double pole switch for controlling supply of electrical power to the electrical device, said double pole switch connected to said two conductor electrical cable for disconnecting both electrical conductors of the electrical device from electrical power thereby eliminating a potential source of E-field radiation.

14. An apparatus as recited in claim 13, wherein said double pole switch is a double-pole-single-throw switch.

15. An apparatus as recited in claim 1, wherein the ungrounded electrical device comprises an electrical bed covering heating means.

16. An apparatus as recited in claim 1, wherein the ungrounded electrical device comprises an electrical heating apparatus.

17. An apparatus as recited in claim 16, wherein the electrical heating apparatus comprises a waterbed heating device.

18. An apparatus as recited in claim 16, wherein the electrical heating apparatus comprises a heating pad.

19. An apparatus as recited in claim 1, wherein the ungrounded electrical device comprises a video display terminal.

20. An apparatus as recited in claim 1, wherein the ungrounded electrical device comprises a television receiver.

21. An apparatus as recited in claim 1, wherein said polarized electrical connector comprises a polarized plug having two connecting blades of different sizes.

22. An apparatus as recited in claim 1, further comprising current limiting means for limiting current flow from said electrically conductive shield means to another object, said current limiting means connected between said shield means and said AC neutral return wire.

23. An apparatus as recited in claim 22, wherein said current limiting means comprises resistor means connected between said shield means and said AC neutral return wire.

24. An apparatus as recited in claim 22, further comprising capacitor means connected in parallel with said current limiting means.

25. An apparatus as recited in claim 22, wherein said current limiting means comprises current sensing means for sensing flow of current between said shield means and said AC neutral return wire, and blocking means for blocking flow of said current upon determining that said sensed current has a magnitude in excess of a predetermined threshold value.

26. An E-field shield apparatus for an electrical device, comprising:

electrically conductive shield means for shielding at least one electrical conductor associated with the electrical device;

polarized connecting means for connecting two electrical conductors of the electrical device to an electrical outlet, said polarized connecting means including:

a polarized electrical connector having two connectors for connection to the electrical outlet;

an electrical cable connected at one end to said polarized electrical connector, said electrical cable including two conductors; and a double pole switch for controlling supply of electrical power to the electrical device, said double pole switch connected to said electrical cable for disconnecting both electrical conductors of the electrical device from electrical power thereby eliminating a potential source of E-field radiation;

a first connector of said polarized electrical connector connected to a source of AC power connected to one connector of the electrical outlet;

a second connector of said polarized electrical connector connected to an AC neutral return wire connected to another connector of the electrical outlet;

said second connector connected to said electrically conductive shield means;

said first and second connectors polarized for connection only to the one and another connectors of the electrical connector, respectively.

27. An apparatus as recited in claim 26, wherein said polarized connecting means further includes:

a second polarized connector connected between the two electrical conductors of the electrical device and said two conductors of said electrical cable.

28. A method of shielding E-field emitted by an ungrounded AC electrical appliance, comprising the steps of:

placing an E-field shield in a vicinity of the appliance; and connecting the E-field shield to a neutral terminal of an AC power source.

29. The method of claim 28 wherein said step of placing comprises surrounding at least one electrical conductor of the appliance by the E-field shield.

30. The method of claim 28 wherein said step of connecting comprises using a polarized plug having only two connectors for connecting the appliance only to a hot terminal and to the neutral terminal of the AC power source, and connecting the E-field shield to the connector of the polarized plug connected to the neutral terminal of the AC power source.

* * * * *